United States Patent [19]
Arkin

[11] Patent Number: 5,919,270
[45] Date of Patent: Jul. 6, 1999

[54] PROGRAMMABLE FORMATTER CIRCUIT FOR INTEGRATED CIRCUIT TESTER

[75] Inventor: Brian J. Arkin, Pleasanton, Calif.

[73] Assignee: Credence Systems Corporation, Fremont, Calif.

[21] Appl. No.: 08/920,398

[22] Filed: Aug. 29, 1997

[51] Int. Cl.[6] ................................................. G01R 31/28
[52] U.S. Cl. ............................................. 714/736; 324/765
[58] Field of Search ............................... 371/25.1, 22.33, 371/22.6, 27.1, 27.7, 27.6, 20.4, 22.35, 24, 26, 27.5; 395/183.01, 183.07, 185.01, 183.08, 183.13, 183.19; 364/488–490, 718; 324/765, 763

[56] References Cited

U.S. PATENT DOCUMENTS

| | | | |
|---|---|---|---|
| 5,453,995 | 9/1995 | Behrens | 371/27 |
| 5,479,415 | 12/1995 | Staiger | 371/27 |
| 5,481,549 | 1/1996 | Tokuyama | 371/27 |
| 5,579,251 | 11/1996 | Sato | 364/579 |
| 5,590,137 | 12/1996 | Yamashita | 371/27 |
| 5,659,553 | 8/1997 | Suzuki | 371/25.1 |
| 5,689,515 | 11/1997 | Panis | 371/22.1 |
| 5,696,772 | 12/1997 | Lesmeister | 371/27 |
| 5,717,352 | 2/1998 | Ebiya | 327/166 |
| 5,732,047 | 3/1998 | Niijima | 368/10 |
| 5,748,642 | 5/1998 | Lesmeister | 371/22.1 |
| 5,789,958 | 8/1998 | Chapman et al. | 327/261 |

*Primary Examiner*—Robert W. Beausoliel, Jr.
*Assistant Examiner*—Nadeem Iqbal
*Attorney, Agent, or Firm*—Smith-Hill and Bedell

[57] ABSTRACT

A formatter circuit for channel of a multiple channel integrated circuit tester includes a drive control circuit, a compare circuit, and a random access memory (RAM). The RAM converts each value of input format selection data to corresponding format control data supplied to the drive control and compare circuits. The drive control circuit generates a set of drive control signals which determine the state of a test signal the tester channel supplies to a terminal of a device under test (DUT). The compare circuit determines whether a DUT output signal at the terminal is of an expected logic state. The drive and compare circuits employ multiplexers controlled by the format control data output of the RAM to select from among a variety of alternative data sources referencing desired states of the drive control signals or expected states of the DUT output signals. The formatter architecture permits flexible use of input reference data to provide a wide variety of selectable drive and compare formats.

17 Claims, 6 Drawing Sheets

PROGRAMMABLE FORMATTER CIRCUIT FOR INTEGRATED CIRCUIT TESTER

BACKGROUND OF THE INVENTION

1. Field of the Invention

The present invention relates in general to integrated circuit (IC) testers and in particular to an IC tester having a programmable formatter for providing a wide range of drive and compare format.

2. Description of Related Art

A typical per-pin integrated circuit tester includes a pattern generator and a set of tester channels, one for each pin of an integrated circuit device under test (DUT). The tester organizes a test into a set of successive test cycles, and during each test cycle each channel carries out a test activity at a corresponding DUT pin. For example a tester channel may supply a test signal input to the DUT terminal or may monitor a DUT output signal at the terminal and produce an indicating "FAIL" signal when the DUT output signal does not behave as expected.

The tester includes a pattern generator for supplying "formatset" data (FSET), "timeset" data (TSET) and reference data (PG) to each tester channel for each test cycle. The FSET data references a particular drive or compare format the channel is to use during the test cycle. A "drive format" is a particular manner in which the channel controls the states of its output test signal during the test cycle. A "compare format" is a particular manner in which the channel determines whether the DUT output signal is behaving as expected during the test cycle. The TSET data indicates certain times during a test cycle at which an event is to occur, such as for example, a test signal state change or a DUT output signal comparison. The PG data can be used to indicate desired states of the test signal or expected states of the DUT output signal.

A typical tester channel includes a pin electronics circuit for generating the test signal at the DUT in response to a set of drive control signals indicating the test signal state (high, low or tristate). The pin electronics circuit also monitors the DUT output signal at the terminal and produces compare high (CH) and compare low (CL) signals indicating whether the DUT output signal is currently above a high logic level or below a low logic level. In addition to a pin electronics circuit, each tester channel also includes one or more timing signal generators and a formatter circuit. Each timing signal generator receives the TSET data from the pattern generator at the start of each test cycle and produces a timing signal pulse input to the formatter circuit at a time during the test cycle indicated by the TSET data. The formatter circuit receives the FSET data from the pattern generator at the start of each test cycle and generates the drive control signal inputs to the pin electronics circuit, causing it to carry out a drive format indicated by the FSET data. The formatter may use the PG data to determine the states of the drive control signals and uses the timing signals as references when producing state changes in the control signals. The formatter circuit also samples the compare high CH and CL outputs of the pin electronics circuit to determine whether to assert the FAIL signal during the test cycle using a compare format also referenced by the FSET data. Depending on the compare format specified, the PG data may reference expected states of the CH and CL data. The timing signals indicate when the formatter is to sample the CL and CH data.

As illustrated in FIG. 7, a typical prior art formatter includes a logic circuit 2 receiving the T1, T2, PG and FSET data and producing a set of four output signals applied to set and reset inputs of a pair of flip-flops 3A and 3B. Flip-flop 3A produced the D drive signal and flip-flop 3B produces the Z drive signal. The FSET data references one of a limited set of D and Z drive signal formats that the formatter may produce during the test cycle. In particular the FSET data indicates the number (0–2) of state changes the D and Z signals are to undergo during the test cycle and indicates whether each state change is to occur on the edge the T1 or T2 signal. The drive signal format referenced by the FSET data also indicates whether logic circuit 2 is to use a bit of the PG data as a reference to indicate the state to which a D or Z signal is to change.

The FSET data may alternatively reference a compare format. When the tester channel is to carry out a compare operation, the PG data may indicate expected states of the CH and CL data. Depending on the compare format selected, the formatter circuit may sample the CH and CL data on an edge of one of the T1 or T2 timing signals or may monitor the CH and CL data during a window of time between the T1 and T2 signals. The prior art formatter includes another logic circuit 4 which process the PG and FSET data to produce signals for controlling operations of a window comparator 5 and an edge comparator 6. When enabled by control data from logic circuit 4, window comparator 5 monitors the CH and CL data from the DUT and asserts and output FAIL signal via an OR gate 7 when the CH and/or CL data passes through unexpected states at any time during a window of time bounded by the T1 and T2 timing signals. When edge comparator 6 is enabled by signals from logic circuit 4, it asserts the FAIL signal via OR gate 7 when CH or CL is of an unexpected state upon receiving an edge of the T1 or T2 signal.

Since the FSET data input to the formatter selects a particular drive or compare format, and since that FSET data has only 4 bits, it can only select one of sixteen drive or compare formats because a 4-bit word has only sixteen different values. The nature of the 16 different formats is determined by the design of logic circuits 2 and 4. Thus prior art logic decoders 2 and 4 are specifically designed to provide the drive and compare formats that will be needed for the types of tests that the tester is expected to perform. Accordingly, when designing a test for an integrated circuit, a user must take into account the limited number of available drive and compare formats. The user cannot specify drive or compare formats that are not designed into logic circuit 2 or 4.

The formatter architecture of FIG. 7 makes rather inflexible use of its input data when providing drive and compare formats, and therefore provides only a limited number of drive and compare formats. What is needed is a formatter for an integrated circuit tester that is highly flexible in the manner in which it uses input data and timing signals to produce drive and compare formats so that it provides a much larger number of useful drive and compare formats and allows a user the flexibility to design test formats to be employed.

SUMMARY OF THE INVENTION

An integrated circuit tester in accordance with the present invention includes a pattern generator and a set of tester channels, one for each pin of an integrated circuit device under test (DUT). The tester organizes a test into a set of successive test cycles, and during each test cycle each channel may supply a test signal input to the DUT terminal or may monitor a DUT output signal at the terminal and produce an indicating "FAIL" signal when the DUT output signal does not behave as expected. The tester includes a pattern generator for producing "formatset" data (FSET), "timeset" data (TSET) and reference data (PG) supplied to each tester channel before the start of each test cycle. The FSET data references a particular drive or compare format the channel is to use during the cycle.

Each tester channel includes a pin electronics circuit for generating the test signal at the DUT in response to a set of drive control signals indicating the test signal state (high, low or tristate). The pin electronics circuit also monitors the DUT output signal at the terminal and produces compare high (CH) and compare low (CL) signals indicating whether the DUT output signal is currently above a high logic level or below a low logic level.

In addition to a pin electronics circuit, each tester channel also includes two timing signal generators and a formatter circuit in accordance with the present invention. Each timing signal generator receives the TSET data from the pattern generator at the start of each test cycle and produces a timing signal pulse at a time during the test cycle indicated by the TSET data. The formatter circuit includes a drive control circuit, a compare circuit, and a random access memory (RAM). The RAM converts each value of FSET data to corresponding format control data supplied to the drive control and compare control circuits.

In accordance with one aspect of the invention, the drive control circuit includes a set of pulse shapers, each for generating a separate one of the drive control signals. Each pulse shaper includes two multiplexers, each multiplexer corresponding to a separate one of the two timing signals. Each multiplexer receives as inputs the reference data bits PG produced by the pattern generator, inverted PG bits, hard wired high and low logic bits and a bit matching a previous output of the other multiplexer. Each multiplexer produces an output signal having a state determined by one of its inputs selected in response to a separate portion of the format control data output of the RAM. Each pulse shaper also includes logic circuitry which sets a state of one of the drive control signals to match the state of each multiplexer's output signal in response to each pulse of the multiplexer's corresponding timing signal.

In accordance with another aspect of the invention, the compare circuit includes a high expect select circuit and a low expect select circuit. Each expect select circuit includes two multiplexers, one corresponding to each of the two timing signals. Each multiplexer receives as inputs the reference data bits PG produced by the pattern generator, inverted PG bits, hard wired high and low logic bits and a bit matching a previous output of the other multiplexer. Each multiplexer produces an output signal having a state determined by one of its inputs selected in response to a separate portion of the format control data output of the formatter RAM. The compare circuit also includes a fail logic circuit for sampling the output signal produced by each expect circuit multiplexer in response to a pulse of the multiplexer's corresponding timing signal, for performing a comparison of sampled expect signals to the compare bits generated by the pin electronics circuit, and for generating the FAIL signal in response to a result of the comparison.

In accordance with a further aspect of the invention, the compare circuit also includes a window expect circuit including two multiplexers. Each multiplexer receives as inputs the reference data bits PG produced by the pattern generator, inverted PG bits, hard wired high and low logic bits and a bit matching a previous output of the other multiplexer. Each multiplexer produces an output window control signal having a state determined by one of its inputs selected in response to a separate portion of the format control data output of the RAM. The window expect circuit also includes a window logic circuit receiving the window control signals, the two timing signals, and the compare high and compare low bits produced by the pin electronics circuit. The window logic circuit produces four signals indicating whether the CH or CL bit transitioned high or low at any moment during a window of time between pulses of the two timing signals. States of the two window control signals determine which timing signal opens the time window and which timing signal closes it. The fail logic circuit samples the indicating signals in response to pulses of the two timing signals and asserts the FAIL signal when two or more of the indicating signals are asserted.

The formatter circuit in accordance with the present invention makes flexible use of input data and timing signals to provide a wide variety of drive and compare formats. It is accordingly an object of the invention to provide a format circuit for an integrated circuit tester which gives the tester the capability of executing any of a wide variety of drive and compare formats at each terminal of a device under test.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 illustrates an integrated circuit tester in accordance with the present invention, FIG. 2, illustrates the period generator and one timing generator of FIG. 1 in more detailed block diagram form;

FIG. 3 illustrates a typical formatter of FIG. 1 in more detailed block diagram form, FIG. 4 illustrates the drive logic circuit of FIG. 3 in more detailed block diagram form, FIG. 5 illustrates the compare logic circuit of FIG. 3 in more detailed block diagram form, FIG. 6 depicts the pattern generator of FIG. 1 in more detailed block diagram form, and FIG. 7 depicts a prior art formatter circuit.

DESCRIPTION OF THE PREFERRED EMBODIMENT(S)

Figure 1:
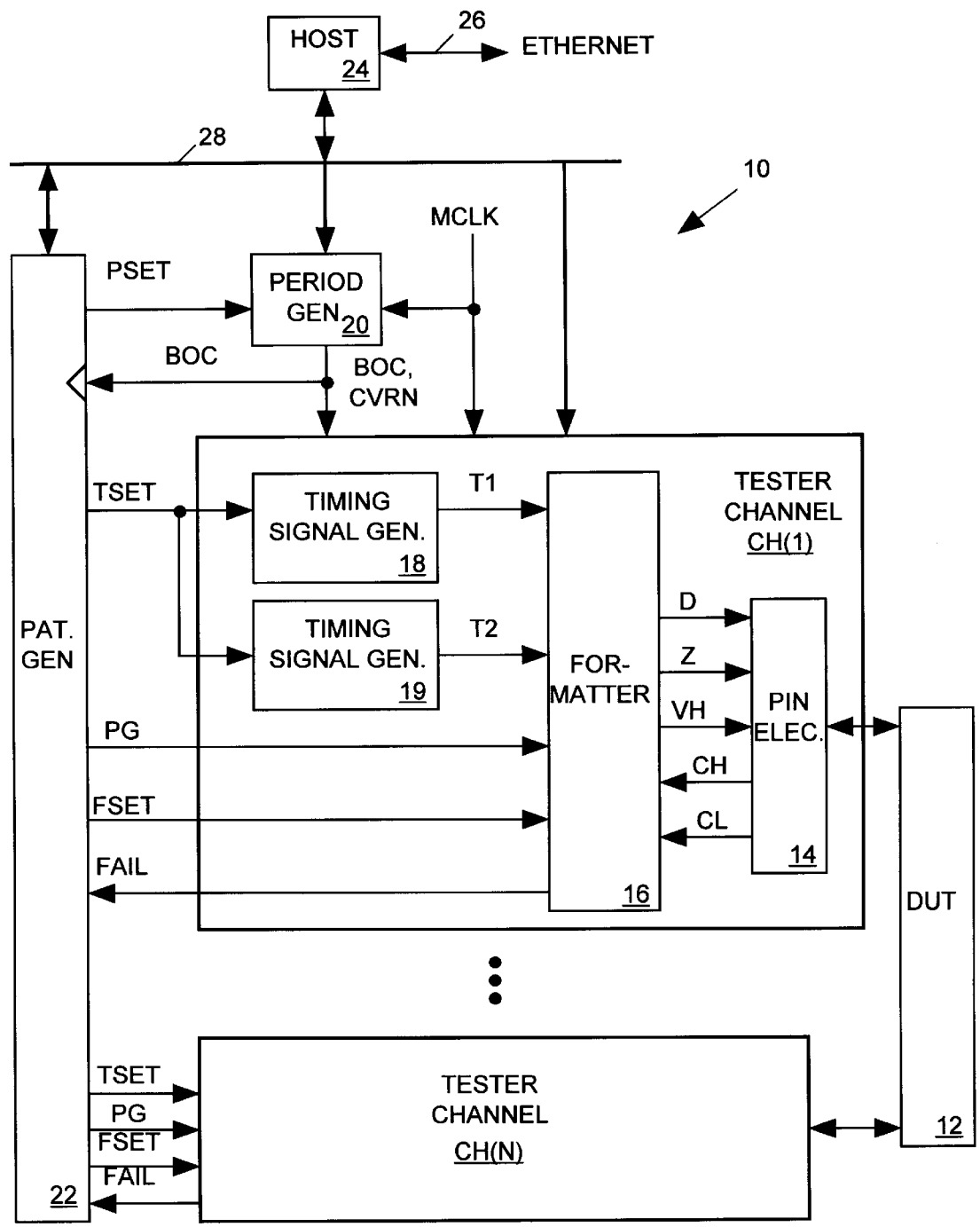

FIG. 1 illustrates an integrated circuit tester 10 in accordance with the present invention for performing a test of an integrated circuit device under test (DUT) 12. Tester 10 includes a set of N channels CH(1)–CH(N), one for each pin or terminal of DUT 12. Tester 10 organizes a test into a set of successive test cycles and during each test cycle each channel CH(1)–CH(N) carries out a test activity at a corresponding DUT terminal. For example a tester channel may supply a test signal input to the DUT terminal or may monitor a DUT output signal at the terminal and produce an output FAIL signal when the DUT output signal does not behave as expected.

Tester 10 tester includes a pattern generator 22 for producing "formatset" data (FSET), "timeset" data (TSET), "periodset" data (PSET) and reference data (PG) for each test cycle. The FSET data references a particular drive or compare format the channel is to use during the cycle. A "drive format" is a particular manner in which the channel controls the states of its output test signal during the test cycle. A drive format includes the manner in which the channel acquires data that determines successive test signal states during the test cycle. A "compare format" is a particular manner in which the channel determines whether the DUT output signal is behaving as expected during the test cycle. A compare format includes the manner in which the channel determines the expected states of the output signal and the manner in which the channel compares the output signal to its expected states and produces the FAIL signal. The TSET data indicates certain times during a test cycle at which an event is to occur, such as for example, a test signal state change or a DUT output signal comparison. The PSET data value indicates how long the test cycle is to last.

The PSET data value is supplied to a period generator 20 at the start of each test cycle. Period generator 20 responds to the PSET data value by generating a reference signal BOC and a data value CVRN. The BOC signal tells each channel CH(1)–CH(N) that the next test cycle is to begin following a next pulse of a master clock signal MCLK. The CVRN data indicates how long after that next MCLK signal the next test cycle actually begins.

Each tester channel CH(1)–CH(N) includes a pin electronics circuit 14 for generating the test signal at the DUT in response to a set of drive control signals (D, Z and VH). The D control signal tells the pin electronics circuit 14 whether to drive its output test signal to a high or low logic level. The VH signal tells the pin electronic circuit whether to drive its output signal to a secondary voltage. The Z control signal tells the pin electronics circuit when to tristate the output test signal. During each test cycle the pin electronics circuit 14 also monitors the DUT output signal (if any) at the DUT terminal and produces compare high and compare low signals (CH and CL) indicating whether the DUT output signal is currently above a high logic level or below a low logic level.

In addition to pin electronics circuit 14, each tester channel CH(1)–CH(N) includes a formatter circuit 16 and two timing signal generators 18 and 19. Each timing signal generator 18 or 19 receives TSET data from pattern generator 22 and the BOC and CVRN signals from period generator 20 at the start of each test cycle and pulses an output timing signal T1 or T2 once during each test cycle with a delay following the start of the test cycle indicated by the TSET data.

Formatter circuit 16 receives the FSET data from pattern generator 20 and supplies the drive control signals D, Z and VH to pin electronics circuit 14 causing it to carry out a drive format indicated by the FSET data. In some drive formats, the PG data indicates states to which the formatter is to set the drive control signals. The timing signals T1 and T2 tell formatter circuit 16 when to adjust states of drive control signals D, Z and VH. When the FSET data references a compare format, formatter circuit 16 samples the compare high CH and CL outputs of the pin electronics circuit at times indicated by the T1 and/or T2 timing signals and determines from the samples whether to assert the FAIL signal during the test cycle. In some compare formats the PG data references expected states of the CH and CL data. During the test, pattern generator 22 also receives, stores and processes FAIL data produced by formatter circuit 16.

To define a test to be performed, input programming data is supplied to a conventional host computer 24 via an Ethernet bus 26. Host computer 24 distributes the programming data via a conventional computer bus 28 to various control registers and memories within formatter circuit 16, pattern generator 22, period generator 20, timing generators 18 and 19, and pin electronics circuits 14. The programming data supplied to pattern generator 22 tells the pattern generator how to produce its output pattern of PSET, TSET, FSET and PG data for each test cycle. The programming data supplied to period generator 20 relates a cycle period length to each possible value of PSET. The programming data supplied to timing generators 18 and 19 relates a particular T1 and T2 timing signal pulse delay to each possible value of TSET. Programming data supplied to pin electronics circuit 14 indicates various parameters of DUT 12 including high and low test signal voltages and output signal comparison logic levels. The programming data supplied to the formatter 16 of each channel relates particular drive and control formats to each possible value of FSET data.

Period Generator

Figure 2:
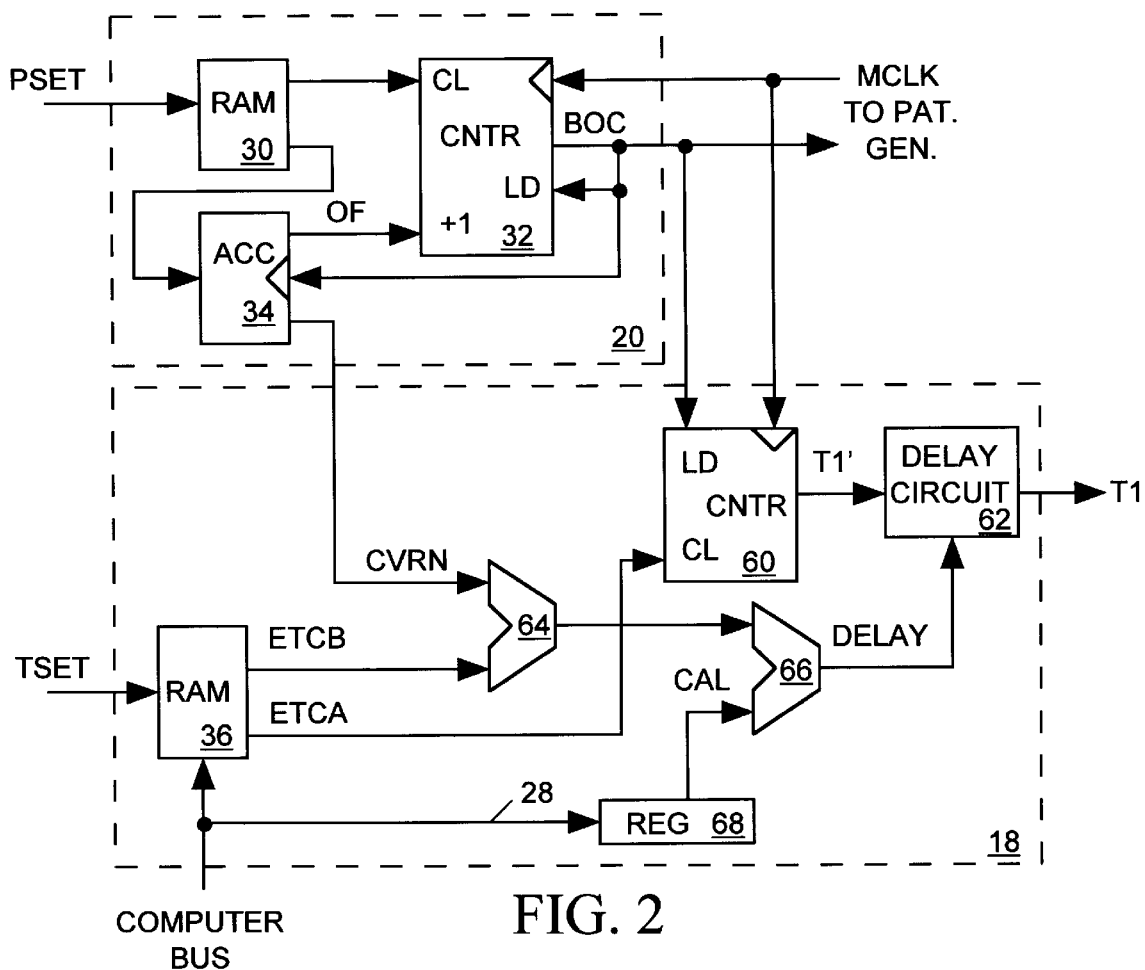

FIG. 2 illustrates period generator edge generator 20 of FIG. 1 in more detailed block diagram. A test cycle spans a whole and fractional number of master clock MCLK cycles. Referring to FIG. 2, period generator 20 includes a RAM 30, a counter 32 and an accumulator 34. RAM 30, addressed by the PSET data from pattern generator 22 of FIG. 1 stores programming data from host 24 of FIG. 1 at each address. The programming data relates each value of PSET to a period length and includes WHOLE and FRACTION values indicating the duration of a test cycle in terms of a whole number and fractional portion of an MCLK period. On the trailing edge of each BOC signal pulse, the WHOLE data value is loaded into counter 32 and the FRACTION data value is accumulated by accumulator 34. Counter 32 then begins counting MCLK signal pulses. When its count reaches WHOLE, counter 32 generates a next BOC pulse. The leading edge of the BOC pulse tells pattern generator 22 of FIG. 1 to produce a new PSET value, thereby causing RAM 30 to produce a WHOLE/FRACTION data pair for the next test cycle. Accumulator 34, clocked by the BOC signal, accumulates successive FRACTION data values to produce the CVRN data. Accumulator 34 overflows when the accumulated CVRN data indicates a period greater than one MCLK cycle and provides an overflow signal OF to a +1 input of counter 32. When counter 32 next loads a WHOLE value it sets its count limit to WHOLE+1. Thus the BOC output of counter 32 indicates a last MCLK pulse preceding a start of a next test cycle. The CVRN data indicates a fractional portion of one MCLK cycle following that MCLK pulse that the next test cycle actually begins.

Thus timing signal generator 18 of FIG. 1, also detailed in FIG. 2, pulses timing signal T1 once after the start of each test cycle with a delay indicated by the TSET data from pattern generator 22 of FIG. 1. The BOC signal and CVRN data from period generator 20 indicate the start of a test cycle. Timing signal generator 18 includes a RAM 36, addressed by the TSET data from pattern generator 22 of FIG. 1. RAM 36 stores programming data from host 24 of FIG. 1 at each address relating each value of TEST to a delay time. The BOC signal load enables a counter 60 clocked by the MCLK signal. When load enabled, counter 60 loads a portion (ETCA) of the data output of RAM 36. Thereafter, counter 60 counts to a count limit indicted by the ETCA data and then produces an output signal T1'. A programmable delay circuit 62 delays the T1' signal with a delay determined by input data DELAY. A pair of adders 64 and 66 add the CVRN output of accumulator 34 and a calibration data value CAL stored in a register 52 to another portion (ETCB)

of the data output of RAM 36 to produce the DELAY data value. The host computer 24 stores the calibration data CAL in register 68 before the test. The CAL data value is separately adjusted for each channel to calibrate out channel-to-channel differences in delay between a state change in MCLK and a resulting state changes in test signals arriving at the DUT terminal.

Timing signal generator produces a T1 signal pulse during each test cycle. The selected BOC signal indicates that the next test cycle begins at some point after the next MCLK pulse. The CVRN data indicates how long after that MCLK pulse that the next test cycle actually begins. The ETCA value indicates how many MCLK cycles counter 60 is to wait following the start of the next test cycle before generating a T1' pulse. The ETCB data indicates the amount of time delay circuit 62 is to delay the T1' signal in order to produce a T1 signal pulse. The adjustable delay of delay circuit 62 ranges from 0–1 MCLK period. Timing signal generator 19 is similar in construction to timing generator 18 of FIG. 2.

Formatter

Figure 3:
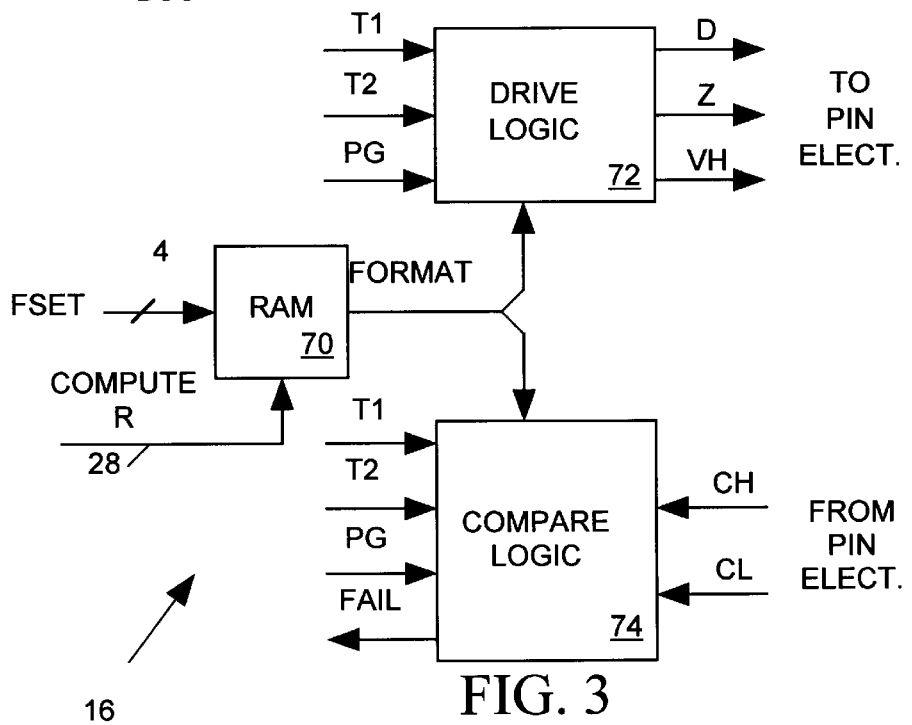

FIG. 3 illustrates formatter 16 of FIG. 1 in accordance with the present invention in more detailed block diagram form. Referring to FIG. 3, formatter 16 receives a 4-bit FSET data value from pattern generator 22 for each test cycle. The FSET data indicates a particular test format to be carried out by a tester channel at the DUT terminal during the test cycle. The 4-bit FSET data value addresses a RAM 70, having 16 storage locations, one for each value of the FSET data. Before the test begins, the host computer 24 of FIG. 1 stores format control data (FORMAT) in each storage location of RAM 70 via computer bus 28. Although each channel is capable of executing a large number of different types of test formats, the FSET data value supplied to the formatter 16 has only four bits and can only take on 16 different values. Thus the FSET data value can only represent 16 of the large number of different test formats the formatter can produce. The data stored in the 16 storage locations of RAM 70 of the formatter 16 of each tester channel determines which 16 of the many possible test formats the channel will be able to perform during the test. Although a channel may carry out only one of 16 drive or compare formats during any test, this is not a significant limitation on tester capability since tests normally require fewer than 16 different drive and compare formats at any one DUT terminal. Also, since the RAM 70 of the formatter 16 of each tester channel may receive different programming data from host 24 of FIG. 1, the tester channels do not all have to be programmed for the same 16 test formats.

During the test, when an incoming FSET data values address RAM 70, RAM 70 reads out a portion of the addressed FORMAT data to a drive logic circuit 72 and reads out another portion of the addressed FORMAT data to a compare logic circuit 74. The drive logic circuit 72 also receives the T1 and T2 timing signals from the timing generators 18 and 19 of FIG. 1 and the reference data bits PG from pattern generator 22. Drive logic circuit 72 supplies the output D, Z and VH signals to pin electronics circuit 14, with the particular sequence of state changes in the D, Z and VH signals being controlled by the FORMAT data, and with the timing of those state changes being controlled by the T1 and T2 timing signals. In some drive formats bits of the reference data PG from pattern generator 22 indicate states to which the D, Z and/or VH signals are to be driven. In other drive formats, the new states of the D, Z and/or VH signals are specified by the format itself and are independent of the PG data.

The compare logic circuit 74 also receives the T1 and T2 timing signals and reference data PG as well as the compare high (CH) and compare low (CL) output signals of pin electronics circuit 14 of FIG. 1. The compare logic circuit 74 compares the CH and/or CL signals to expected states and asserts the FAIL signal when the CH and CL signal states are not as expected during a test cycle. The FORMAT data controls the manner (format) in which compare logic circuit 74 carries out the comparison and the T1 and T2 signals are used to control the timing of the comparison. In some compare formats the two-bit reference data PG indicates expected states CH and CL signal states. In other compare formats, the expected states are specified by the format itself and are independent of the PG data.

Drive Logic

Figure 4:
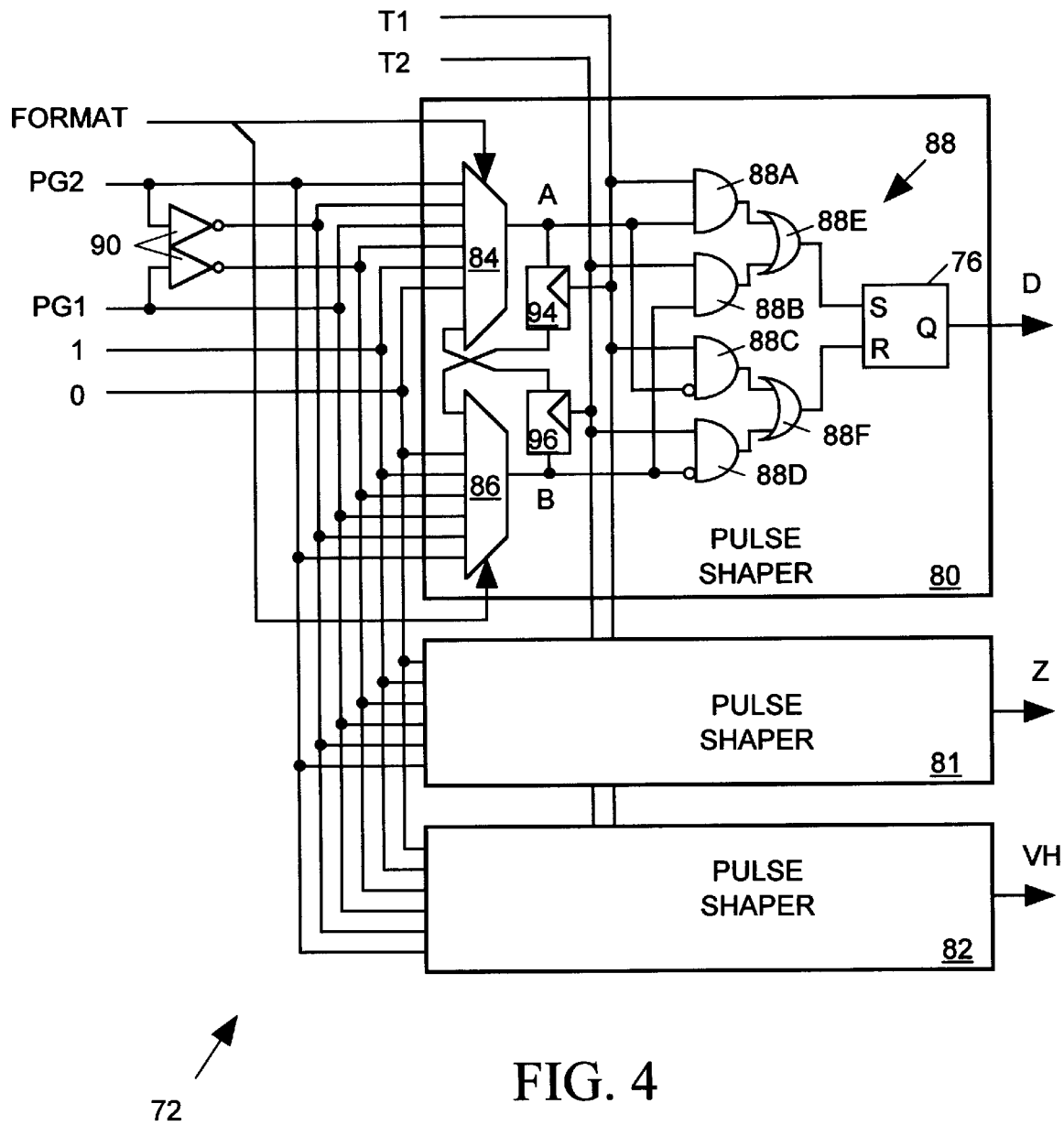

FIG. 4 illustrates the drive logic circuit 72 of FIG. 3 in more detailed block diagram form. Drive logic circuit 72 includes a set of three similar pulse shaper circuits 80–82 for respectively producing the D, Z and VH drive signals supplied to the pin electronics circuit 14 of FIG. 1. Pulse shaper circuit 80 includes a flip-flop 76 having set and reset inputs (S,R) and producing the D drive signal. Pulse shaper 80 also includes a pair of multiplexers 84 and 86, each controlled by a separate portion of the FORMAT data from RAM 70 of FIG. 3. Multiplexer 84 selects from among 7 input data signals to provide an input signal A to a logic circuit 88 that controls the S and R inputs of flip-flop 76. These 7 data signals include the two PG bits (PG1 and PG2) from the pattern generator 22 of FIG. 1, hard wired high and low logic levels ("0", and "1"), and output signal B of multiplexer 86 delayed one test cycle by a latch 96 clocked by T2. Multiplexer 84 also receives the PG1 and PG2 bits inverted by inverters 90. Multiplexer 86 also selects from among the 7 input data signals to provide input signal B to logic circuit 88, the data signals including the inverted and non-inverted PG bits (PG1 and PG2), the hardwired high and low logic levels, and output signal A of multiplexer 84 delayed one test cycle by a latch 94 clocked by T1.

Logic circuit 88 includes a set of four AND gates 88A–88D and to OR gates 88E and 88F. AND gate 88A receives the T1 signal and the A output of multiplexer 84 and drives an input of OR gate 88E. AND gate 88B receives the T2 signal and the B output of multiplexer 86 and drives another input of OR gate 88E. OR gate 88E drives the set input S of flip-flop 76. AND gate 88D receives the T1 signal and the (inverted) A output of multiplexer 84 and drives an input of OR gate 88F. AND gate 88C receives the T1 timing signal and the (inverted) B output of multiplexer 86 and drives an input of OR gate 88E. OR gate 88F drives the reset input S of flip-flop 76.

The T1 signal enables input signal A to logic circuit 88 and allows it to either set or reset flip-flop 76, depending on the state of the A signal when T1 is asserted. Similarly the T2 timing signal input to logic circuit 88 enables signal B and allows it to either set or reset flip-flop 76. Thus the T1 and T2 timing signals control the timing of the edges of the drive signal D supplied to the pin electronics circuit, while the FORMAT data values selects a data source for controlling the state to which the drive signal changes. Pulse shaper circuits 81 and 82 which produce the Z and VH drive signals are similar to circuit 80. Thus, as may be seen from FIG. 4, the FORMAT data input to drive logic circuit 72 selects one of 7 input sources to control controlling state changes in each output signal D, VH and Z and selects the T1 and/or the T2 signal as a reference for timing those state changes.

Compare Logic

Figure 5:
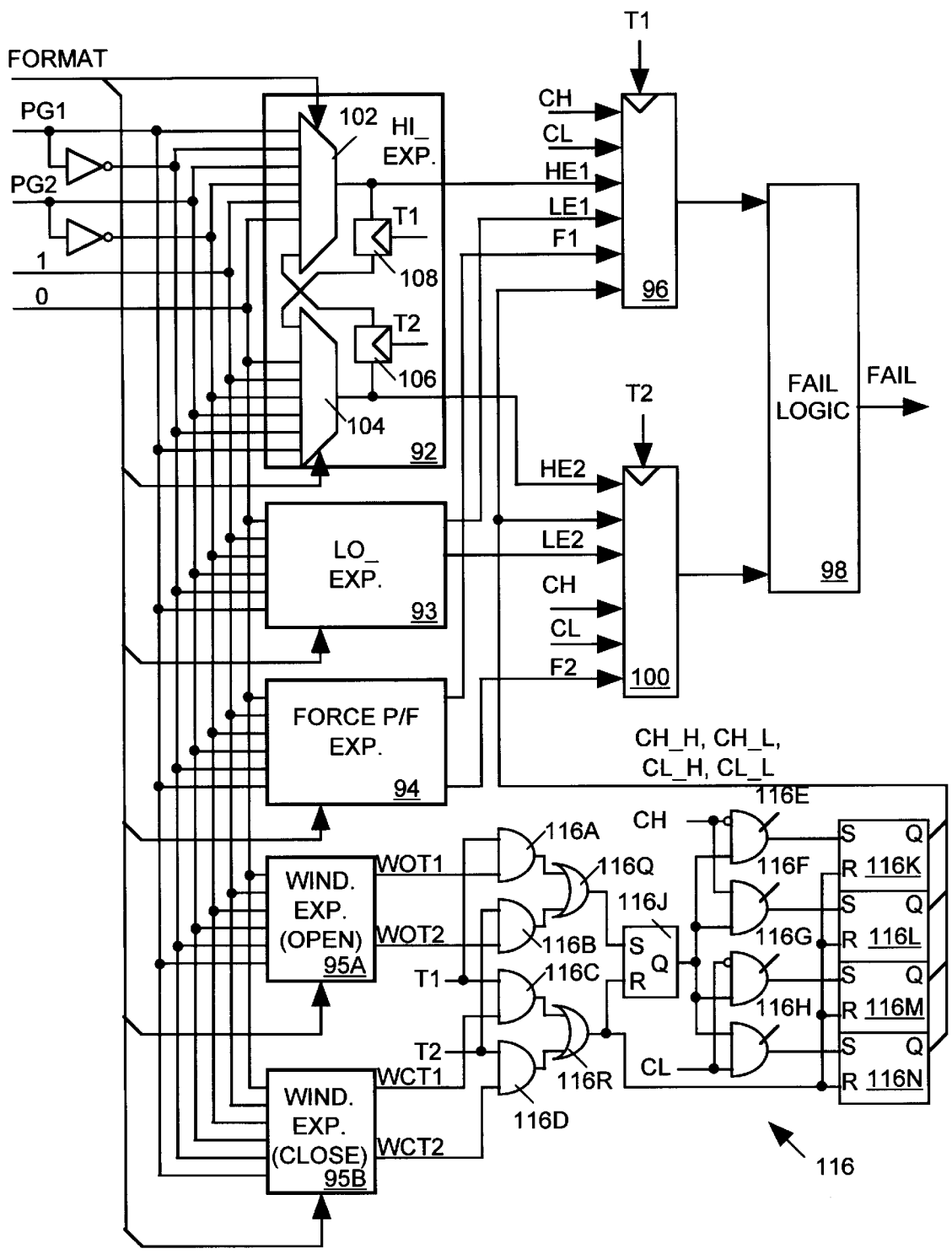

FIG. 5 illustrates the compare logic circuit 74 of FIG. 3 in more detailed block diagram form. Compare logic circuit 74 includes a set of "expect data selection" circuits 92–95. A high expect data selection circuit 92 produces two output signals HE1 and HE2 during each test cycle. The HE1 signal is asserted when the DUT output is expected to be logically high on a rising edge of the T1 timing signal. The T1 signal clocks the HE1 signal and the compare high signal CH from the pin electronics circuit 14 of FIG. 1 through a latch 96 to a fail logic circuit 98. If the DUT is working properly, then when the DUT output signal is expected to be a logical "1" on the T1 signal edge, both CH and HE1 should be high. If the CH input to fail logic circuit 98 is low when HE1 is high, then the DUT output is in error and fail logic circuit 98 will assert the FAIL signal. The HE2 signal is asserted during a test cycle when the DUT output is expected to be logically high on a rising edge of the T2 timing signal. The T2 signal clocks the HE2 signal and the CH signal through a latch 100 to fail logic circuit 98. Fail logic circuit also asserts the FAIL signal whenever HE2 goes high by CH does not.

High expect data selection circuit 92 includes a pair of multiplexers 102 and 104 for producing the HE1 and HE2 signals, each multiplexer being controlled by separate portions of the FORMAT data from the formatter RAM 70 of FIG. 3. Multiplexer 102 produces the HE1 signal by selecting one of seven inputs including non-inverted and inverted PG1 and PG2 bits, hardwired logical 0 and logical 1 bits, and the HE2 signal output of multiplexer 104 delayed one test cycle by a latch 106. Multiplexer 104 produces the HE2 signal by selecting one of seven inputs including non-inverted and inverted PG1 and PG2 bits, hardwired logical 0 and logical 1 bits, and the HE1 signal output of multiplexer 102 delayed one test cycle by a latch 108. Thus the FORMAT data selects the source of data indicating the expected state of the compare high CH output of the pin electronics circuit and also determines whether the expected output is to be sampled on the T1 or T2 timing signal edge.

A low expect data selection circuit 93, force pass/fail expect data selection circuit 94 and window select expect data selection circuit 95 are similar to high expect circuit 92 but are controlled by separate portions of the FORMAT data. The low expect circuit asserts a low expect signal LE1 or LE2 to indicate when the DUT output signal is to be logically low on the edge of either the T1 or T2 timing signal. These signals, along with the compare low data CL from the pin electronics circuits are also latched by latches 96 and 100 onto input of FAIL logic circuit 98. Fail logic circuit asserts the FAIL signal when either LE1 or LE2 is high but its corresponding CL input is low. The force pass/fail circuit 94 asserts an F1 or an F2 signal to force the fail logic circuit to assert or deassert the FAIL signal on an edge of the T1 or T2 timing signal regardless of the state of CH or CL. The F1 and F2 signals also pass through latches 96 and 100, respectively, to inputs of the force logic circuit.

In a "window expect mode" of operation, the DUT is expected to produce a constant high, low or tristate output signal during a window of time between any two T1 and T2 timing edges and not to "glitch" to an incorrect state during the time window. A window expect data selection circuit 95A similar to hi_expect circuit 92 produces output signals WOT1 and WOT2 indicating whether the window is to open on the T1 or T2. A similar window expect data selection circuit 95B produces output signals WCT1 or WCT2 indicating whether the window is to close on the T1 or T2. A window logic circuit 116 receives the T1, T2, CH, CL, W1 and W2 signals and produces a set of four output indicating signals that pass through latches 96 and 100 to fail logic circuit 98. A CH_H signal indicates whether the CH signal went high at some point during the time window and a CH_L signal indicates whether the CH signal transitioned low at some point during the time window. A CL_H signal indicates whether the CL signal went high at some point during the time window and a CH_L signal indicates whether the CH signal went low at some point during the window. Latches 96 and 100 supply these signals to fail logic circuit 98 on the T1 and T2 edges. Fail circuit 98 will assert the FAIL signal to indicate that the DUT output signal went through an unexpected state when CH_H and CH_L are both true, or when CL_H and CL_L are both true.

The window circuit 116 includes a set of AND gates 116A–116H, a set of flip-flops 116J–116N and a pair of OR gates 116Q and 116R. AND gate 116A, receiving the T1 and WOT1 signals, and AND gate 116B, receiving the T2 and WOT2 signals drive inputs of OR gate 116Q controlling the set input of flip-flip 116J. AND gate 116C, receiving the T1 signal and the WCT1 signal, and AND gate 116B, receiving the T2 signal and the WCT2 signal drive inputs of OR gate 116R controlling the reset input of flip-flop 116J. Flip-flop 116J is set when the time window is open and reset when the window is closed. The output of OR gate 116R resets all flip-flops 116K–116N. AND gate 116E, receiving the output of flip-flop 116J and an inverted compare high signal CH drives the set input of flip-flop 116K which produces the CH_L signal. AND gate 116F, receiving the output of flip-flop 116J the compare high signal CH drives the set input of flip-flop 116L which produces the CH_H signal. AND gate 116G, receiving the output of flip-flop 116J and an inverted compare low signal CL drives the set input of flip-flop 116M which produces the CL_L signal. AND gate 116H, receiving the output of flip-flop 116J and the compare low signal CL drives the set input of flip-flop 116L which produces the CL_H signal.

As may be deduced from FIGS. 3–5, formatter 16 is capable of producing any of an enormous range of drive or compare formats. The FORMAT data input to pulse shaper 80 of the drive circuit 72 of FIG. 4 can select any of 49 different D signal drive formats each of which can make the D signal rise or fall on either the T1 and/or T2 signals in accordance with any selected one of seven sources of data. Similarly the FORMAT data input to pulse shapers 81 and 82 of drive circuit 72 can provide up to 49 Z drive signal formats and 49 VH drive signal formats. Thus the FORMAT data input to drive circuit 72 can select an overall drive format providing any one of $49^3$ different combinations of D,Z and VH drive formats. Compare circuit 74 of FIG. 5 provides $49^4$ alternative compare formats since it provides 4 data section circuits 92–95, each providing 49 different compare formats. Although the 4-bit FSET address RAM 70 of FIG. 3 can only reference one of 16 drive and compare formats, by loading the appropriate FSET-to-FORMAT translation data into RAM 70, a user can separately choose those 16 formats for each tester channel from among a very wide range of available formats.

Pattern Generator

Figure 6:
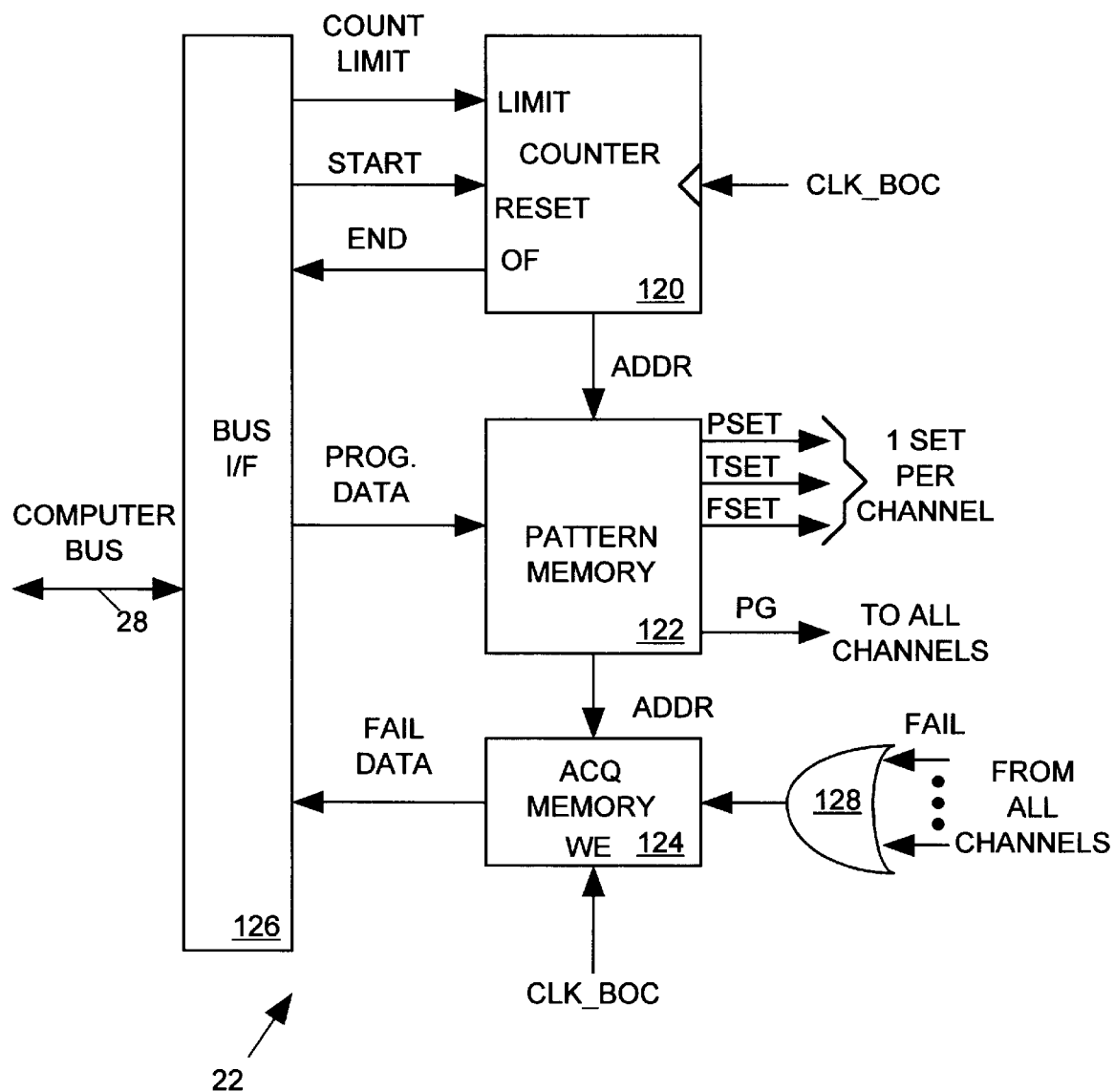
Figure 7:
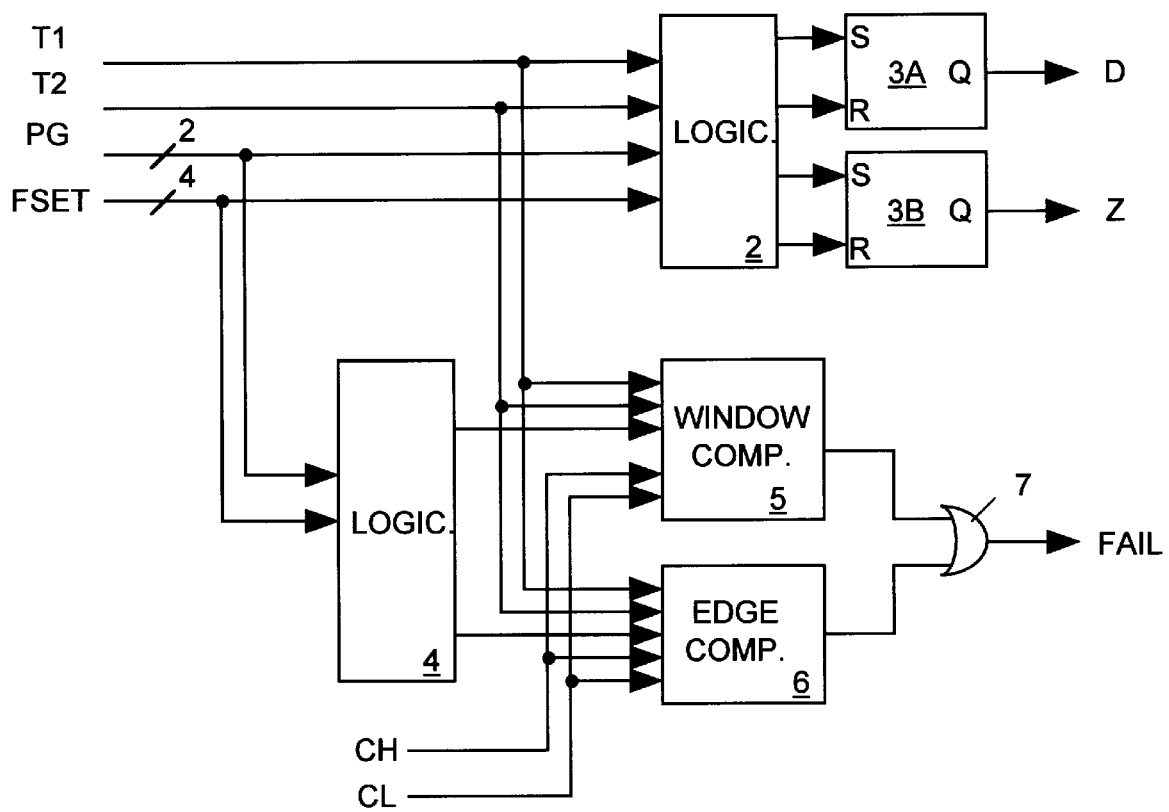

FIG. 6 depicts pattern generator 22 of FIG. 1 in more detailed block diagram form. Pattern generator 22 includes a counter 120 clocked by the BOC signal at the start of each main test cycle. The output count of counter 120, indicating the number of main test cycles occurring since the start of the test, address a random access pattern memory 122 and a random access acquisition memory 124. Pattern memory 122 includes an addressable storage location for each main test cycle, each storage location pre-loaded with PSET, TSET, FSET and PG pattern data from host computer 24 of FIG. 1 via computer bus 28 and a conventional bus interface circuit 126. The host also supplies a count limit value to counter 120 via bus interface 126 before the start of the test. The host computer 24 starts the test by sending a START signal to a reset input of counter 120 via bus interface 126. The START signal resets counter 120 to COUNT limit starting the test. Counter 120 resets its ADDR to 0 and then begins incrementing its output ADDR count on each pulse of the BOC signal. Thus before the beginning of each main test cycle, as indicated by the BOC signal, counter 120 increments the address input ADDR to pattern memory 122 so that it produces the appropriate output data pattern for the test cycle. At the end of the test counter 120 overflows its count limit and transmits an END signal to the host via bus interface 126 and bus 28.

During the test, an OR gate 128 ORs the FAIL signals produced by all channels to produce a single FAIL bit supplied as a data input to acquisition memory 124. Acquisition memory 124, write enabled by the BOC at the start of each test cycle and addressed by the ADDR output of counter 120 stores the FAIL bit at the current address. At the end of the test, the host computer can read the fail data out of acquisition memory 124 via bus 28 and interface circuit 126 to obtain the results of the test.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A formatter for an integrated circuit tester of the type which carries out a test on an integrated circuit device under test (DUT), the tester including a pin electronics circuit for transmitting a test signal to the DUT during a succession of test cycles, the formatter receiving input timing signals, format selection data, and reference data prior to a start of each test cycle, and generating in response thereto a set of drive signals having states indicating how the pin electronics circuit is to control the test signal during the test cycle, the formatter comprising:

a random access memory for storing addressable format control data at multiple addresses, said random access memory being addressed by said input format selection data prior to the start of each test cycle and reading out addressed stored format control data in response thereto, and a drive logic circuit for producing the drive control signals in response to said input timing signals, said input reference data and said format control data read out of said random access memory, wherein the format control data tells the drive logic circuit which of said input timing signals are to control times at which the drive logic circuits set states of said drive signals and tells the drive logic circuit whether to set states of said drive signal to a state indicated by said reference data, wherein said drive logic circuit comprises a plurality of pulse shapers, each generating a separate one of said drive signals, each pulse shaper comprising:

a plurality of multiplexers, each multiplexer corresponding to a separate one of said timing signals, each multiplexer receiving a plurality of input data bits including bits derived from said reference data and hard-wired high and low logic level bits, each multiplexer producing an output signal having a state determined by one of said input data bits selected in response to a separate portion of said format control data, and logic means receiving said plurality of timing signals and output signals produced by said multiplexers and generating in response thereto one of said drive signals.

2. The formatter in accordance with claim 1 wherein one of said data inputs to each of said multiplexers is derived from an output signal of another of said multiplexers.

3. The formatter in accordance with claim 1 wherein said logic means sets a state of the generated logic signal in accordance with a state of each multiplexer's output signal in response to each pulse of the multiplexer's corresponding timing signal.

4. The formatter in accordance with claim 3 wherein said logic means comprises:

a flip-flop for producing said drive signal, the flip-flop having set and reset inputs, the flip-flop driving said drive signal to one state when said set input receives a signal pulse and driving said drive signal to another state when said reset input receives a signal pulse;

means for ANDing the output signal of each multiplexer with the multiplexer's corresponding timing signal to produce a plurality of set signals and for ORing the set signals to drive the set input of said flip-flop; and means for inverting the output signal of each multiplexer and ANDing a resulting inverted output signal with the multiplexer's corresponding timing signal to produce a plurality of reset signals and for ORing the reset signals to drive the reset input of said flip-flop.

5. A formatter for an integrated circuit tester of the type which carries out a test on an integrated circuit device under test (DUT), the tester including a pin electronics circuit for transmitting a test signal to the DUT during a succession of test cycles, the formatter receiving input timing signals, format selection data, and reference data prior to a start of each test cycle, and generating in response thereto a set of drive signals having states indicating how the pin electronics circuit is to control the test signal during the test cycle, the formatter comprising:

a random access memory for storing addressable format control data at multiple addresses, said random access memory being addressed by said input format selection data prior to the start of each test cycle and reading out addressed stored format control data in response thereto, and a drive logic circuit for producing the drive control signals in response to said input timing signals, said input reference data and said format control data read out of said random access memory, wherein the format control data tells the drive logic circuit which of said input timing signals are to control times at which the drive logic circuits set states of said drive signals and tells the drive logic circuit whether to set states of said drive signal to a state indicated by said reference data, wherein said pin electronics circuit also monitors an output signal produced by the DUT and produces compare data indicating a logic state of said output signal, the formatter further comprising a compare circuit receiving said compare data, said timing signals, and said format control data read out of said random access memory, the compare circuit processing said compare data in a manner indicated by said format control data to determine whether the output signal is of an expected state during a time indicated by said timing signals, the format control data also indicating how said timing signals indicate said time.

6. The formatter in accordance with claim 5 wherein said compare circuit comprises:

a plurality of expect select circuits, one corresponding to each of said compare bits, each expect select circuit including a plurality of multiplexers, one corresponding to each of said timing signals, each multiplexer receiving a plurality of input data bits including bits derived from said reference data and hard-wired high and low logic level bits, each multiplexer producing an expect signal having a state determined by one of said input data bits selected in response to a separate portion of said format control data, and fail logic means for sampling the expect signal produced by each expect select circuit multiplexer in response to a pulse of the expect select circuit multiplexer's corresponding timing signal, for performing a comparison of sampled expect signals to said compare data, and for setting a state of said fail signal in response to a result of the comparison.

7. The formatter in accordance with claim 6 wherein said compare circuit further comprises a window expect circuit comprising:

a first multiplexer receiving said plurality of input data bits and producing a first window control signal having a state determined by one of said input data bits selected in response to a portion of said format control data, and a second multiplexer receiving said input data bits and producing a second window control signal having a state determined by one of said input data bits selected in response to a portion of said format control data, and window logic means receiving said first and second window control signals, two of said timing signals, and said compare bits, for producing a pair of indicating signals corresponding to each of said compare bits, wherein a first indicating signal of each pair indicates whether the corresponding compare bit was logically high at any moment during a window of time, and wherein a second indicating signal of said pair indicates whether the corresponding compare bit was logically low at any moment during said window of time, where said window of time begins and ends with pulses one of the two timing signals and wherein states of said first and second window control signals determine which pulse of said two timing signals begins said window of time and pulse of said two timing signals ends said window of time.

8. A drive control circuit for an integrated circuit tester for receiving input format control data and input data bits and a plurality of timing signals and for producing in response thereto a plurality of control signals, the drive control circuit comprising plurality of pulse shapers, each generating a separate one of said control signals, each pulse shaper comprising:

a plurality of multiplexers, each multiplexer corresponding to a separate one of said timing signals, each multiplexer receiving said input data bits, each multiplexer producing an output signal having a state determined by one of said input data bits selected in response to a separate portion of the received format control data, and drive logic means receiving said plurality of timing signals and output signals produced by said multiplexers and generating in response thereto one of said control signals wherein said drive logic means sets a state of the generated control signal in accordance with a state of each multiplexer's output signal in response to each pulse of the multiplexer's corresponding timing signal, and wherein said drive logic means comprises:

a flip-flop for producing said control signal, the flip-flop having set and reset inputs, the flip-flop driving said control signal to one state when said set input receives a signal pulse and driving said control signal to another state when said reset input receives a signal pulse;

means for ANDing the output signal of each multiplexer with the multiplexer's corresponding timing signal to produce a plurality of set signals and for ORing the set signals to drive the set input of said flip-flop; and means for inverting the output signal of each multiplexer and ANDing a resulting inverted output signal with the multiplexer's corresponding timing signal to produce a plurality of reset signals and for ORing the reset signals to drive the reset input of said flip-flop.

9. A compare circuit for an integrated circuit tester, the compare circuit receiving input format control data, a plurality of input data bits, a plurality of input compare bits, and a plurality of timing signals, the compare circuit producing in response thereto a fail signal indicting whether said compare bits have expected states, the compare circuit comprising:

a plurality of expect select circuits, one corresponding to each of said compare bits, each expect select circuit including a plurality of multiplexers, one corresponding to each of said timing signals, each multiplexer receiving said input data bits, each multiplexer producing an expect signal having a state determined by one of said input data bits selected in response to a separate portion of the format control data, and fail logic means for sampling the expect signal produced by each expect select circuit multiplexer in response to a pulse of the expect select circuit multiplexer's corresponding timing signal, for performing a comparison of sampled expect signals to said input compare bits, and for setting a state of said fail signal in response to a result of the comparison, wherein one of said data inputs to each of said multiplexers is derived from an output signal of another of said multiplexers; and a window expect circuit comprising:

a first multiplexer receiving said input data bits and producing a first window control signal having a state determined by one of said input data bits selected in response to a portion of said format control data, and a second multiplexer receiving said input data bits and producing a second window control signal having a state determined by one of said input data bits selected in response to a portion of said format control data, and window logic means receiving said first and second window control signals, two of said timing signals, and said compare bits, for producing a pair of indicating signals corresponding to each of said compare bits, wherein a first indicating signal of each pair indicates whether the corresponding compare bit was logically high at any moment during a window of time, and wherein a second indicating signal of said pair indicates whether the corresponding compare bit was logically low at any moment during said window of time, where said window of time begins and ends with pulses one of the two timing signals and wherein states of said first and second window control signals determine which pulse of said two timing signals begins said window of time and pulse of said two timing signals ends said window of time.

10. The compare circuit in accordance with claim 9 wherein said fail logic means also samples indicating signals produced by said window logic means in response to pulses of each of said two timing signals and sets a state of said fail signal in response to states of the sampled indicating signals.

11. A formatter for an integrated circuit tester for receiving input format selection data, input data bits, input compare bits, and a plurality of timing signals and for producing in response thereto a plurality of drive control signals and a fail signal, the formatter comprising:

decoding means for converting each value of said input format selection data to corresponding format control data, a plurality of first multiplexers, each first multiplexer corresponding to a separate one of said timing signals, each first multiplexer receiving said input data bits, each first multiplexer producing an output signal having a state determined by one of said input data bits selected in response to a separate portion of the received format control data, drive logic means receiving said plurality of timing signals and output signals produced by said first multiplexers and generating in response thereto one of said control signals, a plurality of expect select circuits, each corresponding to a separate one of said compare bits and including a plurality of second multiplexer, each second multiplexer corresponding to a separate one of said timing signals, each second multiplexer receiving said input data bits, each second multiplexer producing an expect signal having a state determined by one of said input data bits selected in response to a separate portion of the format control data, and fail logic means for sampling the expect signal produced by each second multiplexer in response to a pulse of the second multiplexer's corresponding timing signal, for performing a comparison of sampled expect signals to said input compare bits, and for setting a state of said fail signal in response to a result of the comparison.

12. The formatter in accordance with claim 11 wherein one of said data inputs to each of said first multiplexers is derived from an output signal of another of said first multiplexers.

13. The formatter in accordance with claim 11 wherein said drive logic means sets a state of the generated control signal in accordance with a state of each first multiplexer's output signal in response to each pulse of the first multiplexer's corresponding timing signal.

14. The formatter in accordance with claim 13 wherein said drive logic means comprises:

a flip-flop for producing said control signal, the flip-flop having set and reset inputs, the flip-flop driving said control signal to one state when said set input receives a signal pulse and driving said control signal to another state when said reset input receives a signal pulse;

means for ANDing the output signal of each first multiplexer with the first multiplexer's corresponding timing signal to produce a plurality of set signals and for ORing the set signals to drive the set input of said flip-flop; and means for inverting the output signal of each first multiplexer and ANDing a resulting inverted output signal with the first multiplexer's corresponding timing signal to produce a plurality of reset signals and for ORing the reset signals to drive the reset input of said flip-flop.

15. The formatter in accordance with claim 11 wherein one of said data inputs to each of said first multiplexers is derived from an output signal of another of said first multiplexers.

16. The formatter in accordance with claim 11 further comprising a window expect circuit comprising:

a third multiplexer receiving said input data bits and producing a first window control signal having a state determined by one of said input data bits selected in response to a portion of said format control data, and a fourth multiplexer receiving said input data bits and producing a second window control signal having a state determined by one of said input data bits selected in response to a portion of said format control data, and window logic means receiving said first and second window control signals, two of said timing signals, and said compare bits, for producing a pair of indicating signals corresponding to each of said compare bits, wherein a first indicating signal of each pair indicates whether the corresponding compare bit was logically high at any moment during a window of time, and wherein a second indicating signal of said pair indicates whether the corresponding compare bit was logically low at any moment during said window of time, where said window of time begins and ends with pulses one of the two timing signals and wherein states of said first and second window control signals determine which pulse of said two timing signals begins said window of time and pulse of said two timing signals ends said window of time.

17. The formatter in accordance with claim 16 wherein said fail logic means also samples indicating signals produced by said window logic means in response to pulses of each of said two timing signals and sets a state of said fail signal in response to states of the sampled indicating signals.

* * * * *

UNITED STATES PATENT AND TRADEMARK OFFICE
CERTIFICATE OF CORRECTION

PATENT NO. : 5,919,270
DATED : July 6, 1999
INVENTOR(S) : Brian J. ARKIN

It is certified that error appears in the above-identified patent and that said Letters Patent is hereby corrected as shown below:

```
Column 12, line 9 (Claim 3, line 2), "logic" should be deleted
and replaced with --drive--.
```

Signed and Sealed this

Seventh Day of December, 1999

Attest:

Q. TODD DICKINSON

*Attesting Officer*   Acting Commissioner of Patents and Trademarks